(12) United States Patent
Kim et al.

(10) Patent No.: US 8,956,923 B2
(45) Date of Patent: Feb. 17, 2015

(54) METHODS OF FABRICATING SEMICONDUCTOR DEVICES AND UNDERFILL EQUIPMENT FOR THE SAME

(71) Applicant: Samsung Electronics Co, Ltd., Suwon-si (KR)

(72) Inventors: Young-Ja Kim, Asani-si (KR); Jun-Young Ko, Cheonan-si (KR); Dae-Young Jeong, Daejeon (KR); Dae-Sang Chan, Asan-si (KR)

(73) Assignee: Samsung Electronics Co., Ltd. (KR)

( * ) Notice: Subject to any disclaimer, the term of this patent is extended or adjusted under 35 U.S.C. 154(b) by 63 days.

(21) Appl. No.: 13/835,749

(22) Filed: Mar. 15, 2013

(65) Prior Publication Data

US 2013/0337616 A1 Dec. 19, 2013

(30) Foreign Application Priority Data

Jun. 18, 2012 (KR) .................. 10-2012-0065100

(51) Int. Cl.
*H01L 21/00* (2006.01)
*B05C 13/02* (2006.01)
*B29C 65/00* (2006.01)
*B05D 5/12* (2006.01)
*H01L 21/56* (2006.01)

(52) U.S. Cl.
CPC ......... *H01L 21/56* (2013.01); *H01L 2924/0002* (2013.01)
USPC ........... 438/127; 118/500; 156/285; 427/96.1

(58) Field of Classification Search
None
See application file for complete search history.

(56) References Cited

U.S. PATENT DOCUMENTS

| | | | |
|---|---|---|---|
| 5,203,076 A * | 4/1993 | Banerji et al. | 29/840 |
| 5,817,545 A | 10/1998 | Wang et al. | |
| 5,998,242 A * | 12/1999 | Kirkpatrick et al. | 438/127 |
| 6,000,924 A | 12/1999 | Wang et al. | |
| 6,255,142 B1 * | 7/2001 | Babiarz et al. | 438/126 |
| D466,140 S | 11/2002 | Huey | |
| D473,883 S | 4/2003 | Huey et al. | |
| D474,214 S | 5/2003 | Huey et al. | |
| 6,796,481 B2 | 9/2004 | Yamauchi | |
| 7,614,888 B2 | 11/2009 | Tong et al. | |
| 2004/0214370 A1 | 10/2004 | Quinones et al. | |
| 2004/0241262 A1 | 12/2004 | Huey et al. | |
| 2007/0111400 A1 * | 5/2007 | Terada et al. | 438/127 |

* cited by examiner

*Primary Examiner* — Andres Munoz
(74) *Attorney, Agent, or Firm* — Onello & Mello, LLP

(57) ABSTRACT

A method of fabricating a semiconductor device comprises loading a circuit board including a semiconductor chip into underfill equipment, positioning the circuit board on a depositing chuck of the underfill equipment, filling an underfill material in a space between the semiconductor chip and the circuit board placed on the depositing chuck; transferring the circuit board including the underfill material so that it is positioned on a post-treatment chuck of the underfill equipment; heating the underfill material of the circuit board placed on the post-treatment chuck in a vacuum state, and unloading the circuit board, of which the underfill material has been heated in the vacuum state, from the underfill equipment.

12 Claims, 14 Drawing Sheets

METHODS OF FABRICATING SEMICONDUCTOR DEVICES AND UNDERFILL EQUIPMENT FOR THE SAME

CROSS-REFERENCE TO RELATED APPLICATION

This application claims priority under 35 U.S.C. §119 to Korean Patent Application No. 10-2012-0065100 filed on Jun. 18, 2012, the disclosure of which is hereby incorporated by reference in its entirety.

BACKGROUND

1. Field

Embodiments of the inventive concepts relate to methods of fabricating semiconductor devices including filling an underfill material in a space between a circuit board and a semiconductor chip, and underfill equipment for the same

2. Description of Related Art

Electronic devices commonly include circuit boards and semiconductor chips. The semiconductor chips may be bonded, for example flip-chip-bonded, to the circuit board. In such a bond, it is common for an underfill material to be filled in the space between the circuit board and the semiconductor chip. Various methods for rapidly removing voids formed within the underfill material during fabrication of semiconductor devices, have been studied.

SUMMARY

Embodiments of the inventive concepts provide a method of fabricating semiconductor devices in a manner that substantially or completely eliminates voids that otherwise would be present within an underfill material positioned in a space between a semiconductor chip and a circuit board in a relatively short amount of time.

Other embodiments of the inventive concepts provide underfill equipment capable of filling an underfill material in a space between a circuit board and a semiconductor chip, and capable of removing any voids present within the underfill material in relatively short amount of time.

Aspects of the inventive concepts should not be limited by the above description, and other unmentioned aspects will be clearly understood by one of ordinary skill in the art from example embodiments described herein.

In an aspect of the inventive concepts, a method of fabricating a semiconductor device comprises: loading a circuit board including a semiconductor chip into underfill equipment; positioning the circuit board on a depositing chuck of the underfill equipment; filling an underfill material in a space between the semiconductor chip and the circuit board positioned on the depositing chuck; moving the circuit board including the underfill material so that it is positioned on a post-treatment chuck of the underfill equipment; heating the underfill material of the circuit board placed on the post-treatment chuck in a vacuum state; and unloading the circuit board including the underfill material which has been heated in the vacuum state, from the underfill equipment.

In some embodiments, heating the underfill material of the circuit board in a vacuum state includes: moving the circuit board on the post-treatment chuck to within a post-treatment cover; sealing the post-treatment cover; maintaining an interior volume of the post-treatment cover in the vacuum state; and heating the underfill material.

In some embodiments, sealing the post-treatment cover includes closing an opened area of the post-treatment cover with the post-treatment chuck.

In some embodiments, closing an opened area of the post-treatment cover with the post-treatment chuck is performed simultaneously with moving the circuit board to within the post-treatment cover.

In some embodiments, maintaining the interior volume of the post-treatment cover in the vacuum state includes exhausting the interior volume of the post-treatment cover through a vacuum hole of the post-treatment chuck.

In some embodiments, heating the underfill material includes heating the circuit board using a heater of the post-treatment chuck.

In some embodiments, loading the circuit board into underfill equipment includes moving the circuit board on a first transfer unit of the underfill equipment, wherein unloading the circuit board from the underfill equipment includes moving the circuit board to a second transfer unit of the underfill equipment.

In some embodiments, moving the circuit board so that it is positioned on the post-treatment chuck includes: positioning the circuit board at a third transfer unit of the underfill equipment; raising the third transfer unit to space the circuit board from the first transfer unit; moving the third transfer unit to a position above the post-treatment chuck; and lowering the third transfer unit.

In some embodiments, filling the underfill material in a space between the semiconductor chip and the circuit board includes: heating the circuit board using a heater of the depositing chuck; and depositing the underfill material on the circuit board at a side position of the semiconductor chip.

In some embodiments, filling the underfill material in a space between the circuit board and the semiconductor chip includes raising the circuit board from the first transfer unit.

In some embodiments, the method further comprises: moving the circuit board on a pre-treatment chuck of the underfill equipment before filling the underfill material in a space between the circuit board and the semiconductor chip; and pre-heating the circuit board by a heater of the pre-treatment chuck.

In another aspect of the inventive concepts, a method of fabricating a semiconductor device, comprises: preparing a circuit board including a semiconductor chip mounted to a first surface of the circuit board; pre-heating the circuit board to a first temperature; depositing an underfill material on the first surface of the circuit board at sides of the semiconductor chip while heating the circuit board, which has been pre-heated to the first temperature, to a second temperature; and heating the underfill material to a third temperature in a vacuum state.

In some embodiments, the second temperature and the third temperature are higher than room temperature, and lower than a temperature at which viscosity of the underfill material has a lowest value.

In some embodiments, the second temperature is equal to the third temperature.

In some embodiments, the first temperature is lower than the second temperature.

In another aspect of the inventive concepts, a method of fabricating a semiconductor device, comprises: performing an underfill operation on a semiconductor chip applied to a circuit board to provide an underfill material between the semiconductor chip and the circuit board; and following performing the underfill operation, performing a post-treatment operation on the underfill material by: placing the underfill material in a vacuum state; and while the underfill material is placed in a vacuum state, heating the underfill material.

In some embodiments, heating the underfill material while the underfill material is in a vacuum state comprises heating the underfill material to lower a viscosity of the underfill material.

In some embodiments, performing the post-treatment operation comprises: applying the circuit board to a post-treatment chuck; sealing the post-treatment chuck with a post-treatment cover to contain a volume including the underfill material; applying a vacuum to the volume while heating the underfill material.

In some embodiments, the underfill operation is performed on a transfer unit and further comprising, after applying the circuit board to the post-treatment chuck, raising the circuit board relative to the transfer unit using the post-treatment chuck.

In some embodiments, the method further comprises heating the circuit board and semiconductor chip during performing the underfill operation.

Details of other embodiments are included in the detailed description and drawings.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF EMBODIMENTS

Figure 1:
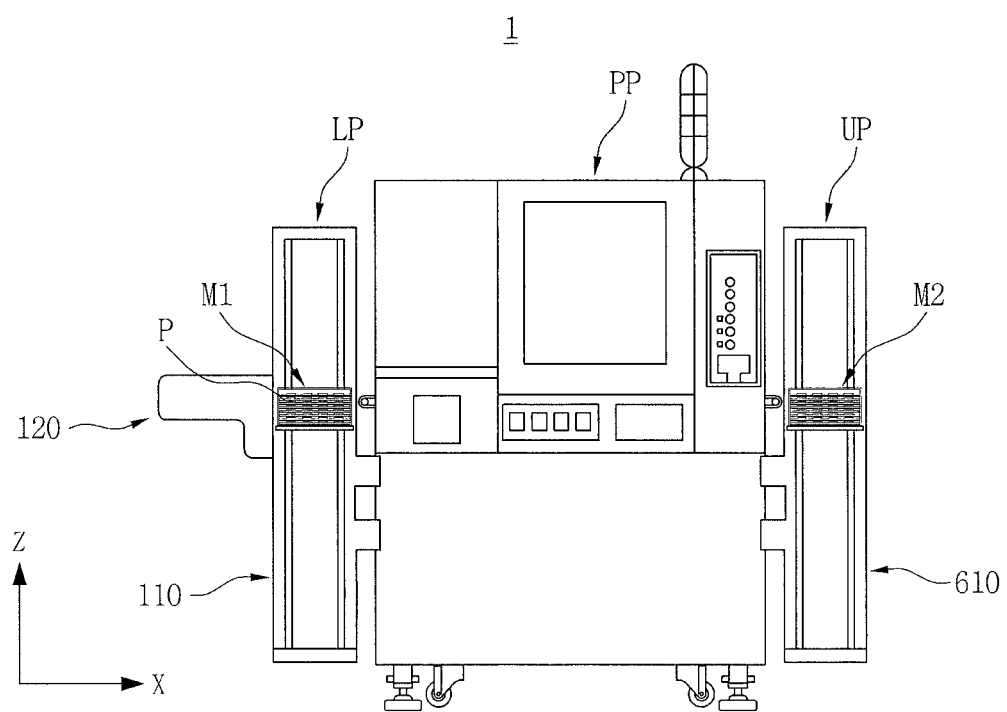
FIG. 1 is a side view illustrating underfill equipment according to an embodiment of the inventive concepts.

Example embodiments of the inventive concepts are described below in sufficient detail to enable those of ordinary skill in the art to embody and practice the embodiments. It is important to understand that the inventive concepts may be embodied in many alternate forms and should not be construed as limited to the example embodiments set forth herein.

Like numbers refer to like elements throughout. In the drawings, the thicknesses of layers and regions may be exaggerated for clarity. It will also be understood that when a layer is referred to as being "on" another layer or substrate, it can be directly on the other layer or substrate or intervening layers may also be present.

It will be understood that, although the terms first, second, A, B, etc. may be used herein in reference to elements of the inventive concepts, such elements should not be construed as limited by these terms. For example, a first element could be termed a second element, and a second element could be termed a first element, without departing from the scope of the present invention. Herein, the term "and/or" includes any and all combinations of one or more elements.

The terminology used herein to describe embodiments of the invention is not intended to limit the scope of the invention. The articles "a," "an," and "the" are singular in that they have a single referent, however the use of the singular form in the present document should not preclude the presence of more than one referent. In other words, elements of the invention referred to in the singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Unless otherwise defined, all terms (including technical and scientific terms) used herein are to be interpreted as is customary in the art to which this disclosure belongs. It will be further understood that terms in common usage should also be interpreted as is customary in the relevant art and not in an idealized or overly formal sense unless expressly so defined herein.

Figure 2:
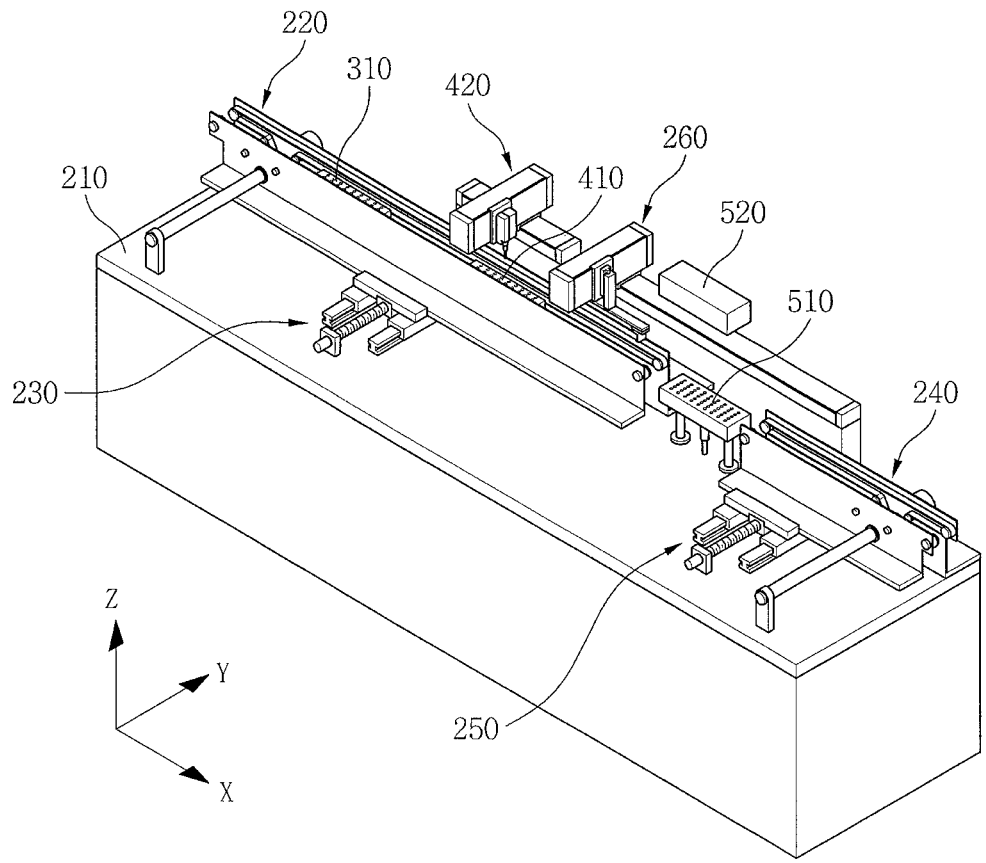
FIG. 2 is a perspective view illustrating a processing part of underfill equipment according to an embodiment of the inventive concepts.
Figure 3:
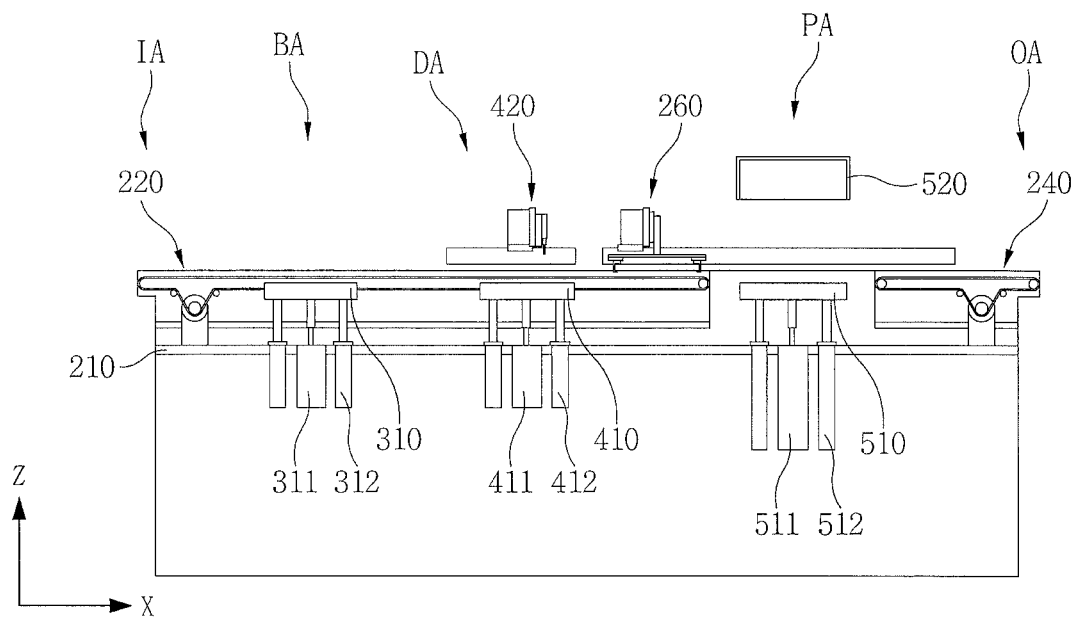
FIG. 3 is a side view illustrating a processing part of underfill equipment according to an embodiment of the inventive concepts.

FIG. 1 is a side view illustrating underfill equipment according to an embodiment of the inventive concepts. FIGS. 2 and 3 are views illustrating a processing part of underfill equipment according to an embodiment of the inventive concepts. FIGS. 4 to 14 are views partially illustrating a processing part of underfill equipment according to an embodiment of the inventive concepts.

Referring to FIGS. 1 to 14, underfill equipment 1 according to an embodiment of the inventive concepts may include a loading part LP, a processing part PP, and an unloading part UP. The processing part PP may be disposed between the loading part LP and the unloading part UP. The loading part LP, the processing part PP, and the unloading part UP may be arranged in a first (X-axis) direction.

The loading part LP may provide a circuit board P to the processing part PP for processing. The circuit boards P may include at least one semiconductor chip C. In some embodiments, the semiconductor chip C may be flip-chip-bonded on the circuit board P; however, other forms of bonding are equally applicable to the principles of the present inventive concepts; In some embodiments, the semiconductor chip C may be connected to the circuit board P by a plurality of connection members S. The plurality of connection members S may include a conductive material. For example, the plurality of connection members S may include a solder material.

As shown in FIG. 1, the loading part LP may include a loading elevator 110 and a loading pusher 120.

The loading elevator 110 may transfer a circuit board P to be processed to the processing part PP. The loading elevator 110 may be disposed between the processing part PP and the loading pusher 120. The corresponding circuit board P to be provided to the processing part PP may be transferred to a front position of the loading pusher 120 by the loading elevator 110.

At least one first magazine M1 may be stacked on the loading elevator 110. The first magazine M1 may receive a plurality of circuit boards P. The loading elevator 110 may transfer the first magazine M1 so that the plurality of circuit boards P are sequentially provided to the processing part PP. The loading elevator 110 may transfer the first magazine M1 in a vertical (Z-axis) direction. For example, the first magazine M1 may be raised and/or lowered by the loading elevator 110.

The loading pusher 110 may sequentially push the plurality of circuit boards P received in the first magazine M1 in the first (X-axis) direction. The loading pusher 110 may provide a corresponding circuit board P of the first magazine M1 to the processing part PP. In some embodiments, the loading pusher 110 may comprise a hydraulic cylinder which is configured to move in the first (X-axis) direction.

The processing part PP may fill an underfill material in a space between the semiconductor chip C and the circuit board P provided from the loading part LP. The processing part PP may be constructed and arranged to rapidly remove voids from the underfill material. In some embodiments, the underfill material may include a thermosetting resin. For example, the underfill material may include an epoxy resin, or other suitable underfill material.

As shown in FIGS. 2 and 3, the processing part PP may include a main body 210, a first transfer unit 220, a first interval adjusting unit 230, a second transfer unit 240, a second interval adjusting unit 250, a third transfer unit 260, a pre-treatment chuck 310, a depositing chuck 410, a coating unit 420, a post-treatment chuck 510, and a post-treatment cover 520.

The processing unit PP may further include a first chuck vacuum pump 311 and a first chuck driving unit 312 which are connected to the pre-treatment chuck 310. The processing part PP may further include a second chuck vacuum pump 411 and a second chuck driving unit 412 which are connected to the depositing chuck 410. The processing unit PP may further include a third chuck vacuum pump 511 and a third chuck driving unit 512 which are connected to the post-treatment chuck 510.

The main body 210 may further include an inlet area IA, a pre-treatment area BA, a coating area DA, a post-treatment area PA, and an outlet area OA. The inlet area IA may be located close to the loading part LP. The outlet area OA may be located close to the unloading part UP. The coating area DA may be located between the pre-treatment area BA and the post-treatment area PA. The inlet area IA, the pre-treatment area BA, the coating area DA, the post-treatment area PA, and the outlet area OA may be disposed sequentially in the first (X-axis) direction.

The first transfer unit 220 may transfer circuit boards P for processing that are provided from the loading part LP. In some embodiments, the first transfer unit 220 may be located in the regions of the inlet area IA, the pre-treatment area BA, and the coating area DA of the main body 210. The circuit boards P for processing may be transferred onto the first transfer unit 220 by the loading pusher 120. The first transfer unit 220 may extend to the first (X-axis) direction. The first transfer unit 220 may cross the inlet area IA, the pre-treatment area BA, and the coating area DA. The first transfer unit 220 may transfer the circuit board P to the pre-treatment area BA and the coating area DA.

Figure 4:
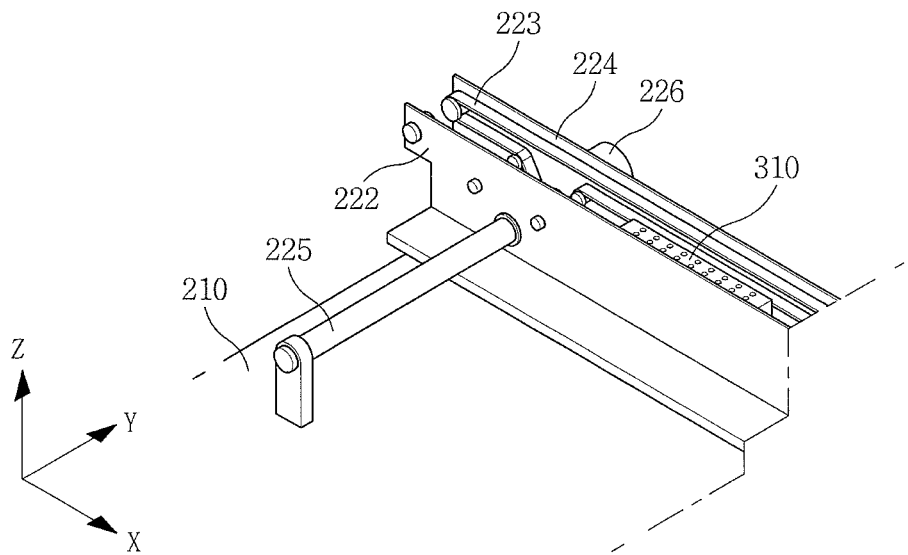
FIG. 4 is a perspective view illustrating an inlet area and a pre-treatment area of a processing part of underfill equipment according to an embodiment of the inventive concepts.
Figure 5:
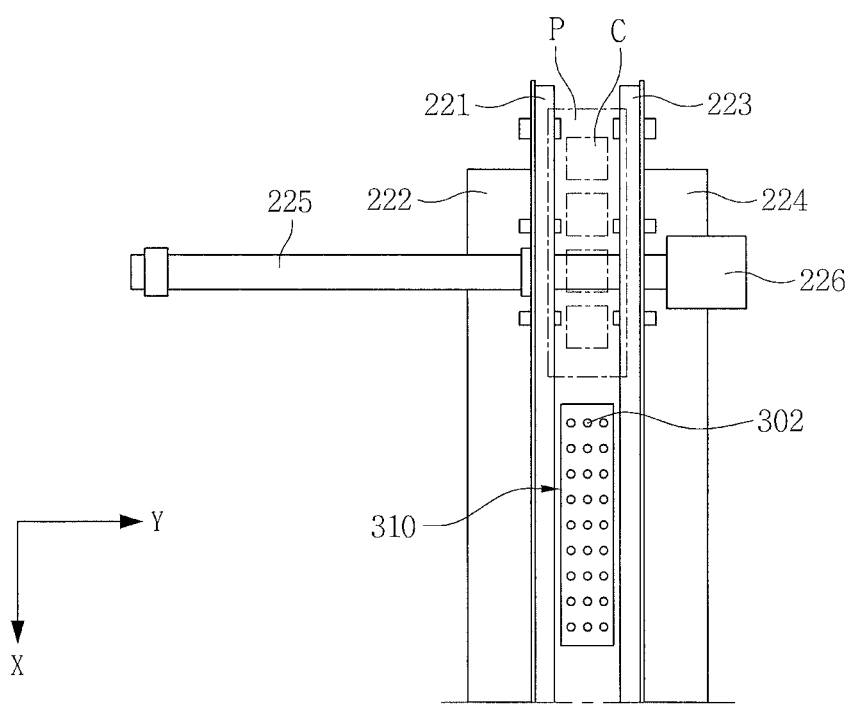
FIG. 5 is a top view illustrating an inlet area and a pre-treatment area of a processing part of underfill equipment according to an embodiment of the inventive concepts.

As shown in FIGS. 4 and 5, in some embodiments, the first transfer unit 220 may include a first left belt 221, a first left wall 222, a first right belt 223, a first right wall 224, a first belt shaft 225, and a first belt driver 226.

The first left belt 221 and the first right belt 223 may extend in the first (X-axis) direction. The first left belt 221 may be spaced apart from the first right belt 223, and the first left belt 221 may be parallel to the first right belt 223. An upper surface level of the first left belt 221 may be equal to that of the first right belt 223.

The first left belt 221 may move relative to the first left wall 222. The first right belt 223 may move relative to the first right wall 224. The first left wall 222 and the first right wall 224 may extend in the first (X-axis) direction, along with the first left belt and first right belt 221, 223. The first left wall 222 may be parallel to the first right wall 224.

In some embodiments, the distance of the space between the first left belt 221 and the first right belt 223 may be smaller than a horizontal width of the circuit boards P to be processed. The horizontal width of the circuit board P is the width of the board P in a second (Y-axis) direction, where the second (Y-axis) direction is perpendicular to the first (X-axis) direction. The first (X-axis) direction and the second (Y-axis) direction may form a plane parallel to an upper surface of the main body 210.

In some embodiments, the distance of the space between the first left wall 222 and the first right wall 224 may be larger than the horizontal width of the circuit board P. The circuit board P may be placed on the first left belt 221 and the first right belt 223. In other embodiments, the distance of the space between the first left wall 222 and the first right wall 224 may be less than the horizontal width of the circuit board P, in which case the circuit board travels in a lengthwise groove of the first transfer unit.

The first belt shaft 225 may pass through the first left wall 222 and the right wall 224. The first belt shaft 225 may be in contact with the first left belt 221 and the first right belt 223. The first belt shaft 225 may be rotated by the first belt driver 226. The first left belt 221 and the first right belt 223 may be made to move at the same speed by the first belt driver 226.

The pre-treatment chuck 310 may be located on the pre-treatment area BA of the main body 210. The pre-treatment chuck 310 is constructed and arranged to pre-heat the circuit board P to a first temperature. In some embodiments, the first temperature may be higher than room temperature. In some embodiments, the first temperature may be lower than a temperature at which the underfill material has the lowest viscosity. For example, the first temperature may be in the range of 80° C. to 120° C.

Figure 6:
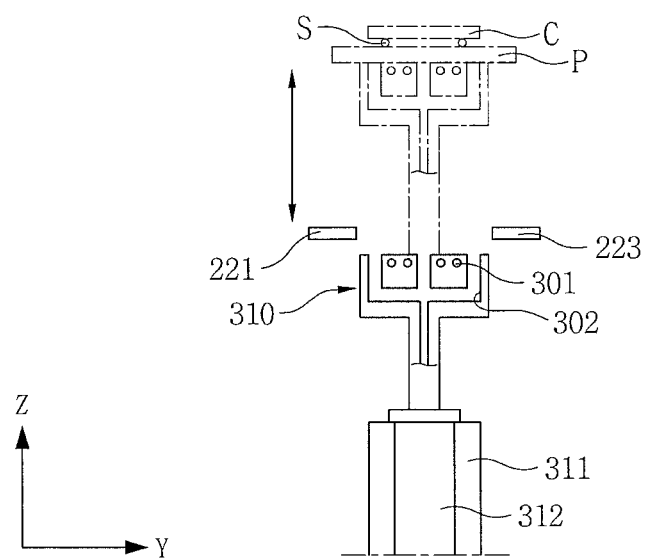
FIG. 6 is a cross-sectional view illustrating a pre-treatment chuck of underfill equipment according to an embodiment of the inventive concepts.

As shown in FIGS. 5 and 6, the pre-treatment chuck 310 may include a first heater 301 and first vacuum holes 302. The first heater 301 may be disposed close to a surface of the pre-treatment chuck 310. The heater 301 may include electrical heat rays.

The first vacuum holes 302 may be connected to the first chuck vacuum pump 311. The first vacuum holes 302 may vacuum-adsorb the circuit board P. The circuit board P may be fixed to the pre-treatment chuck 310 by a vacuum applied through the first vacuum holes 302.

A horizontal width of the pre-treatment chuck 310 may be less than the distance of the space between the first left belt 221 and the first right belt 223. In some embodiments, the pre-treatment chuck 310 may be disposed in the (Y-axis) direction between the first left belt 221 and the first right belt 223. This enables the chuck to make contact with the circuit board P through the space between the belts 221, 223. When disengaged, an upper surface level of the pre-treatment chuck 310 may be lower than those of the first left belt 221 and the first right belt 223.

The first chuck driving unit 312 may transfer the pre-treatment chuck 310 in the vertical (Z-axis) direction. For example, the first chuck driving unit 312 may lift the pre-treatment chuck 310 while the circuit board P is pre-heated to the first temperature. The circuit board P may be spaced from the first transfer unit 220 during a pre-heat treatment while the circuit board P is pre-heated to the first temperature.

The first interval adjusting unit 230, the depositing chuck 410, and the coating unit 420 may be disposed on the coating area DA of the main body 210. The lowermost level of the coating unit 420 may be higher in the (Z-axis) direction than an upper surface level of the first left wall 222 and an upper surface level of the first right wall 224.

The first interval adjusting unit 230 may adjust the distance of the space between the first left belt 221 and the first right belt 223 of the first transfer unit 220. For example, the first interval adjusting unit 230 may allow for adjustment of the positioning the first left belt 221 of the first transfer unit 220 in the second (Y-axis) direction. Alternatively, or, in addition, the first interval adjusting unit 230 may allow for adjustment of the positioning the first right belt 223 of the first transfer unit 220 in the second (Y-axis) direction. The first left wall 222 may be spaced from the main body 210. The first right wall 224 may be in contact with the main body 210.

Figure 7:
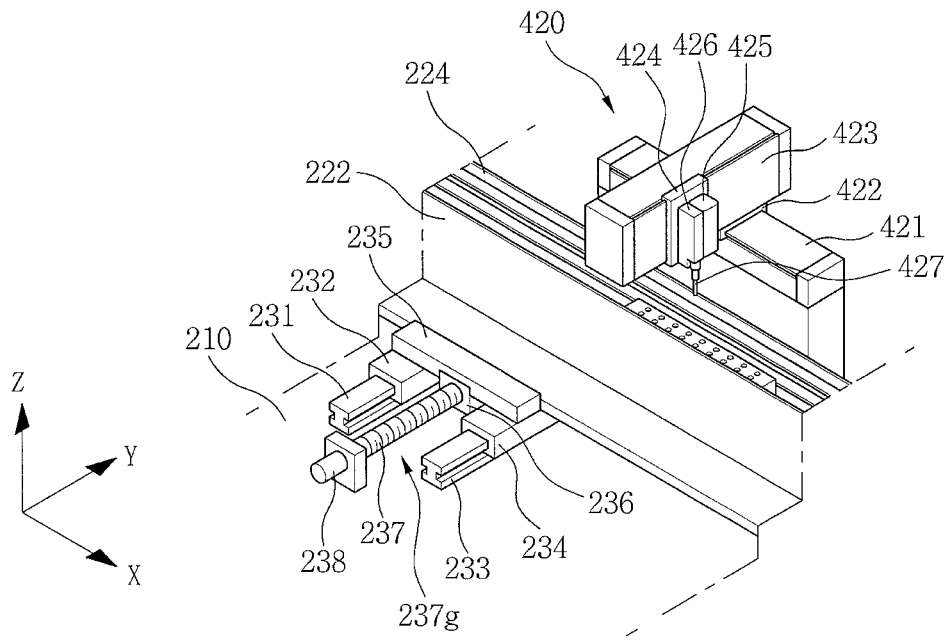
FIG. 7 is a perspective view illustrating a coating area of a processing part of underfill equipment according to an embodiment of the inventive concepts.

As shown in FIG. 7, the first interval adjusting unit 230 may include a first left rail 231, a first left slider 232, a first right rail 233, a first right slider 234, a first bridge 235, a first nut 236, a first interval shaft 237, and a first interval driver 238.

The first left rail 231 and the first right rail 233 may extend in the second (Y-axis) direction. The first left rail 231 may be spaced from the first right rail 233. The first left rail 231 may be parallel to the first right rail 233. An upper surface level of the first left rail 231 may be equal to that of the first right level 233. The first left rail 231 and the first right rail 233 may be in contact with the main body 210.

The first left slider 232 may move along the first left rail 231. The first right slider 234 may move along the first right rail 233. The first left slider 232 and the first right slider 234 may be in contact with the first left wall 222. For example, an upper surface of the first left slider 232 and an upper surface of the first right slider 234 may be in contact with a lower surface of the first left wall 222.

The first bridge 235 may transfer the first left slider 232 and the first right slider 234 equally. The first bridge 235 may extend to the first (X-axis) direction. The first bridge 235 may be in contact with the first left slider 232 and the first right slider 234. For example, the first bridge 235 may be in contact with the upper surface of the first left slider 232 and the upper surface of the first right slider 234. A side of the first bridge 235 may be in contact with that of the first left wall 222.

The first nut 236 may move along the first interval shaft 237. The first nut 236 may be coupled to a bottom of the first bridge 235. The first bridge 235 may move by the first nut 236. The first nut 236 may be spaced from the main body 210. The first nut 236 may be disposed between the first left slider 232 and the first right slider 234. The first nut 236 may be spaced from the first left slider 232 and the first right slider 234.

The first interval shaft 237 may extend to the second (Y-axis) direction. The first interval shaft 237 may be disposed between the first left slider 232 and the first right slider 234. The first interval shaft 237 may be parallel to the first left slider 232 and the first right slider 234. The first interval shaft 237 may be spaced from the main body 210. The first interval shaft 237 may be spaced apart from the first left slider 232 and the first right slider 234.

The first interval shaft 237 may pass through the first nut 236. The first interval shaft 237 may be rotated by the first interval driver 238. The first interval shaft 237 may have a spiral groove 237g. The first nut 236 may move by the spiral groove 237g of the first interval shaft 237. The traveling direction of the first nut 236 may be determined by the rotation direction of the first interval shaft 237.

The coating unit 420 may fill an underfill material UM in the space between the circuit board P and the semiconductor chip C. The coating unit 420 may coat the underfill material UM on the circuit board P. For example, the coating unit 420 may coat the underfill material UM close to a side of the semiconductor chip C.

As shown in FIG. 7, the coating unit 420 may include a first fixed rail 421, a first fixed slider 422, a first moving rail 423, a first moving slider 424, a storage tank 425, a coating controller 426, and a coating nozzle 427.

The first fixed rail 421 may extend in the first (X-axis) direction. The first fixed rail 421 may be parallel to the first transfer unit 220. The first fixed rail 421 may be spaced from the first transfer unit 220. For example, the first fixed rail 421 may be spaced from the first right wall 224 to the second (Y-axis) direction. The first fixed slider 422 may move along the first fixed rail 421.

The first moving rail 423 may be coupled to the fixed slider 422. The first moving rail 423 may be transferred in the first (X-axis) direction by the first fixed slider 422. The first moving rail 423 may move along the first fixed rail 421.

The first moving rail 423 may extend to the second (Y-axis) direction. The first moving rail 423 may cross an upper space of the first transfer unit 220. The first moving rail 423 may cross an upper space of the depositing chuck 410. The coating unit 420 may coat the underfill material UM on the circuit board P placed on the depositing chuck 410. The first moving slider 424 may move along the first moving rail 423.

The storage tank 425 may be constructed and arranged to store the underfill material UM. The coating controller 426 may control the amount of the underfill material UM to be coated using the coating nozzle 427.

The storage tank 425 and the coating controller 426 may be coupled to the first moving slider 424. The coating nozzle 427 may be disposed on a lower surface of the coating controller 426. The coating nozzle 427 may move in the first (X-axis) direction along the first fixed slider 422. The coating nozzle 427 may move in the second (Y-axis) direction along the first moving slider 424.

The depositing chuck 410 may heat the circuit board P to a second temperature during a processing time when the underfill material UM is coated. In some embodiments, the second temperature may be higher than room temperature. The second temperature may be lower than a temperature at which viscosity of the underfill material has the lowest value. For example, the second temperature may be in the range of 80° C. to 120° C. The second temperature may be higher than the first temperature.

Figure 8:
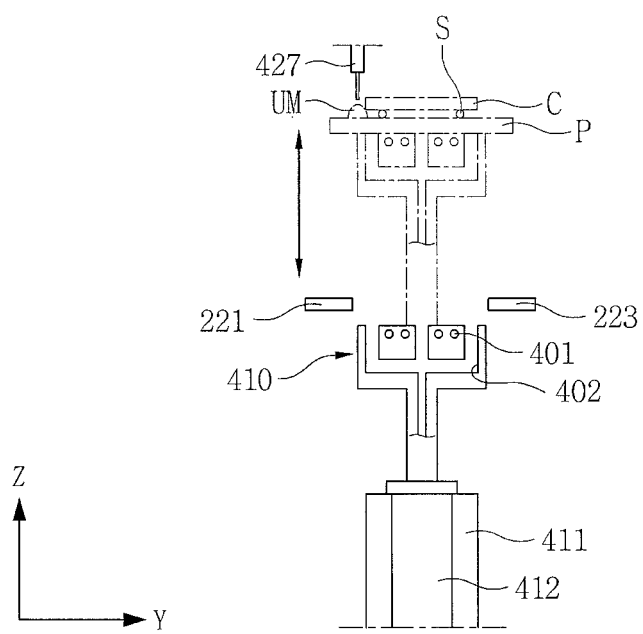
FIG. 8 is a cross-sectional view illustrating a depositing chuck of underfill equipment according to an embodiment of the inventive concepts.

As shown in FIG. 8, the depositing chuck 410 may include a second heater 401 and second vacuum holes 402. The second heater 401 may be disposed close to the surface of the depositing chuck 410. The second heater 401 may be the same as, or similar to, the first heater 301 type. For example, in some embodiments, the second heater 401 may include electrical heating wires, for example, resistance-based heating wires. The second vacuum holes 402 may be connected to the second chuck vacuum pump 411. The circuit board P may be applied to the depositing chuck by a vacuum applied through the second vacuum holes 402.

A horizontal width of the depositing chuck 410 may be smaller than the distance of the space between the first left belt 221 and the first right belt 223. For example, the horizontal width of the depositing chuck 410 may be equal to that of the pre-treatment chuck 310. The depositing chuck 410 may be disposed between the first left belt 221 and the first right belt 223. When disengaged, an upper level of the depositing chuck 410 may be lower than those of the first left belt 221 and the first right belt 223.

The depositing chuck 410 may be translated in the vertical (Z-axis) direction by the second chuck driving unit 411. For example, the second chuck driving unit 411 may lift the depositing chuck 410 before the underfill material UM is coated on the circuit board P. The depositing chuck 410 may move in relative proximity to a bottom of the coating unit 420 before the underfill material UM is coated on the circuit board P. The circuit board P may be spaced from the first transfer unit 220 by the depositing chuck 410 while the underfill material UM is coated.

Figure 9:
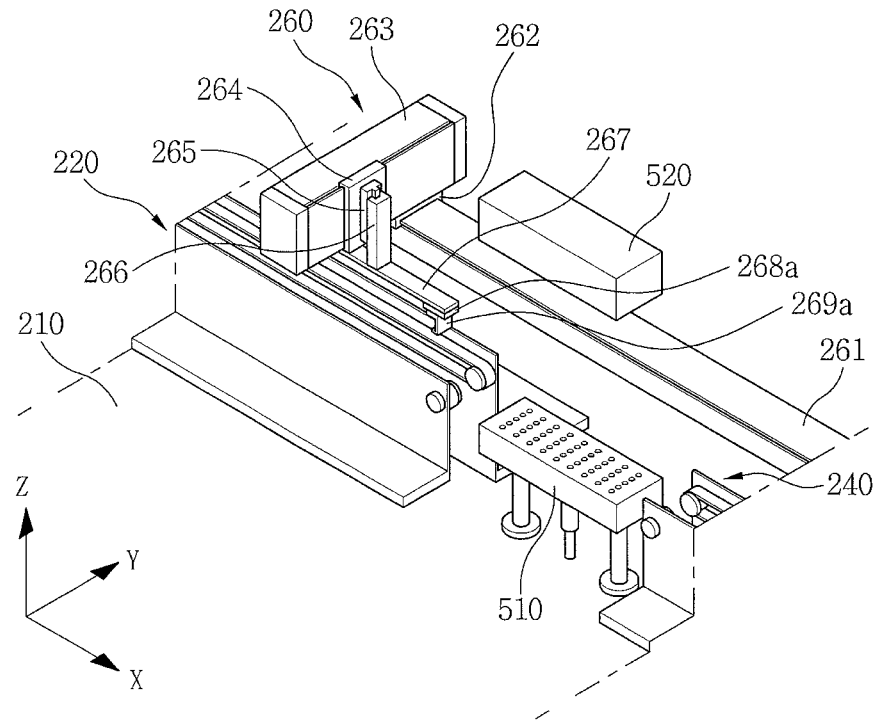
FIG. 9 is a perspective view illustrating a post-treatment area of a processing part of underfill equipment according to an embodiment of the inventive concepts.
Figure 10:
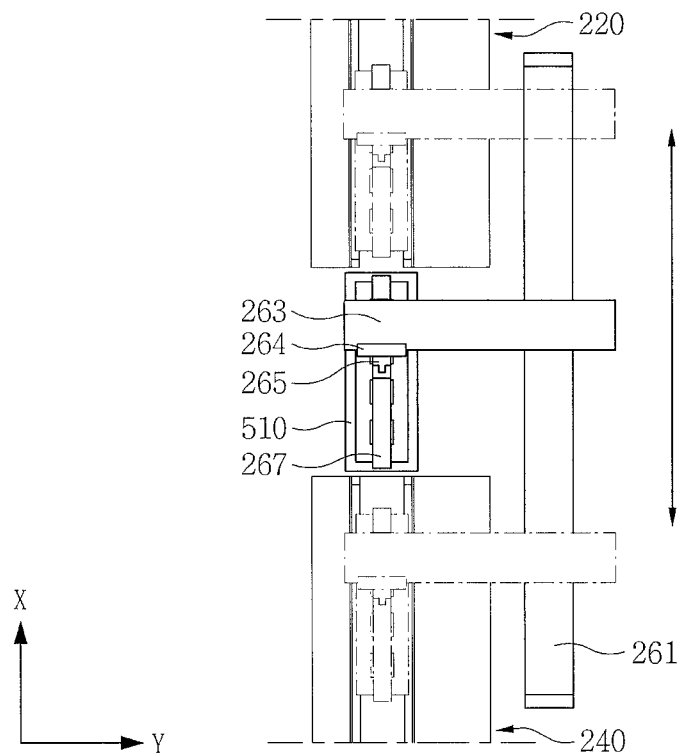
FIG. 10 is a top view illustrating a post-treatment area of a processing part of underfill equipment according to an embodiment of the inventive concepts.
Figure 11:
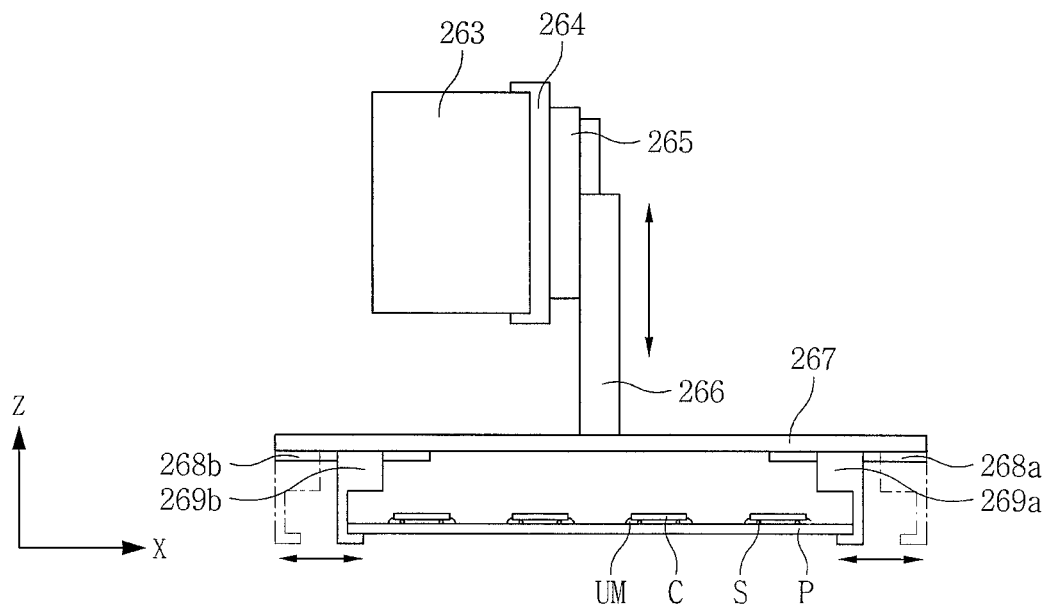
FIG. 11 is a side view illustrating a third transfer unit of underfill equipment according to an embodiment of the inventive concepts.

As shown in FIGS. 9 to 11, the third transfer unit 260, the post-treatment chuck 510, and the post-treatment cover 520 may be disposed on the post-treatment area PA of the main body 210. The post-treatment cover 520 may be disposed above the post-treatment chuck 510 in the direction of the Z-axis. The lowermost level of the post-treatment cover 520 may be higher than the uppermost level of the third transfer unit 260.

The third transfer unit 260 may transfer a circuit board P under processing from a position at the end of the first transfer unit 220 onto the post-treatment chuck 510. The third transfer unit 260 may transfer the circuit board P from on the post-treatment chuck 510 to the second transfer unit 240.

The third transfer unit 260 may include a second fixed rail 261, a second fixed slider 262, a second moving rail 263, a second moving slider 264, a vertical rail 265, a vertical slider 266, a fixed bar 267, a first cramp rail 268a, a second cramp rail 268b, a first fixed cramp 269a, and a second fixed cramp 269b.

The second fixed rail 261 may extend in the first (X-axis) direction. The second fixed rail 261 may be spaced apart from the first transfer unit 220. The second fixed rail 261 may be spaced apart from the second transfer unit 240. For example, the second fixed rail 261 may be spaced from the first transfer unit 220 and the second transfer unit 240 in the second (Y-axis) direction. The second fixed slider 262 may move along the second fixed rail 261.

The second moving rail 263 may be coupled to the second fixed slider 262. The second moving rail 263 may move in the first (X-axis) direction along the second fixed slider 262. The second moving rail 263 may move along the second fixed rail 261.

The second moving rail 263 may extend in the second (Y-axis) direction. Along its transport path, defined by the second fixed rail 261, the second moving rail 263 may be positioned so that it is suspended above the first transfer unit 220, and suspended above the second transfer unit 240. The second moving rail 263 may similarly be suspended above the post-treatment chuck 510. The second moving slider 264 may move along the second moving rail 263.

The vertical rail 265 fixed to the second moving rail 263. The vertical slider 266 may move along the vertical rail 265 in the (Z-axis) direction. The fixed bar 267 may be coupled to the vertical slider 266. The fixed bar 267 may extend to the first (X-axis) direction. The horizontal length of the fixed bar 267 may be longer than that of the circuit board P to be processed. The horizontal length of the fixed bar 267 may denote a length in the first (X-axis) direction.

The first cramp rail 268a and the second cramp rail 268b may be disposed on a lower surface of the fixed bar 267. The first cramp rail 268a and the second cramp rail 268b may extend in the first (X-axis) direction. The first cramp rail 268a may be spaced apart from the second cramp rail 268b.

The first fixed cramp 269a may move along the first cramp rail 268a. The second fixed cramp 269b may move along the second cramp rail 268b. The first fixed cramp 269a may have a cramp shape in which a center direction of the fixed bar 267 is opened. For example, the first fixed cramp 269a may have a 'L' shape when viewed in the second (Y-axis) direction. The second fixed cramp 269b may have a symmetrical shape with the first fixed cramp 269a. For example, the second fixed cramp 269b may have a '] ' shape when viewed in the second (Y-axis) direction.

The post-treatment chuck 510 and the post-treatment cover 520 may heat the underfill material UM filled in the space between the semiconductor chip C and the circuit board P to a third temperature, while the underfill material is in a vacuum state. The third temperature may be higher than room temperature. The third temperature may be lower than the temperature at which viscosity of the underfill material has the lowest value. The third temperature may be equal to the second temperature. For example, the third temperature may be in the range of 80° C. to 120° C.

Figure 12:
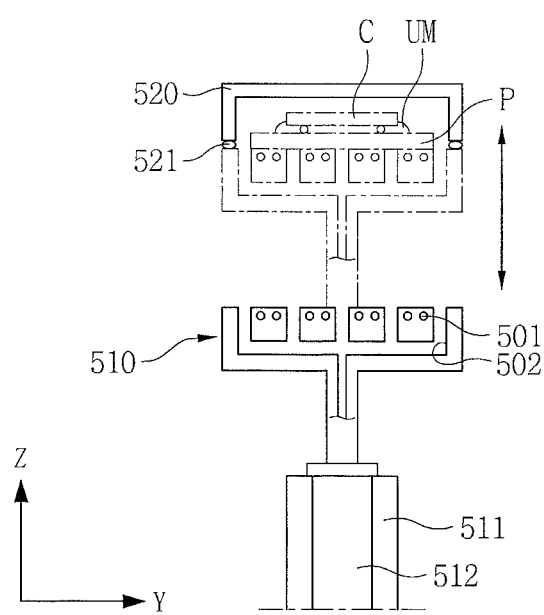
FIG. 12 is a cross-sectional view illustrating a post-treatment chuck and a post-treatment cover of underfill equipment according to a embodiment of the inventive concepts.

As shown in FIG. 12, the post-treatment chuck 510 may include a third heater 501 and third vacuum holes 502. The third heater 501 may be disposed closed to an upper surface of the post-treatment chuck 510. The third heater 501 may be the same as the first heater 301. For example, the third heater 501 may include electrical heat wires. The third vacuum holes 502 may be connected to a third chuck vacuum pump 512. The circuit board P may be applied to the post-treatment chuck 510 by a vacuum applied through the third vacuum holes 502.

The post-treatment chuck 510 may transfer the circuit board P to the inside of the post-treatment cover 520. The third chuck driving unit 511 may transfer the post-treatment chuck 510 to the vertical (Z-axis) direction.

The horizontal width of the post-treatment chuck 510 may be larger than those of the pre-treatment chuck 310 and the depositing chuck 410. The horizontal width of the post-treatment chuck 510 may be larger than that of the circuit board P. For example, the horizontal width of the post-treatment chuck 510 may be greater than the distance of the space between the first left wall 222 and the first right wall 224.

The bottom of the post-treatment cover 520 may be opened. The horizontal width of the post-treatment cover 520 may be equal to that of the post-treatment chuck 510. The horizontal length of the post-treatment cover 520 may be equal to that of the post-treatment chuck 510. The area of the post-treatment cover 520 may be equal to that of the post-treatment chuck 510.

The inside of the post-treatment cover 520 may be sealed by the post-treatment chuck 510. For example, the post-treatment chuck 510 may cover the opened bottom of the post-treatment cover 520. A sealing member 521 may be disposed on an opened side of the post-treatment cover 520. For example, an O-ring or gasket may be disposed on a lower surface of the post-treatment cover 520, or on an upper surface of the post treatment chuck 510, or on both.

The circuit board P may cover only some of the vacuum holes 502 of the post-treatment chuck 510. For example, the vacuum holes 502 of the post-treatment chuck 510 may exhaust the interior volume of the sealed post-treatment cover 520 while the circuit board P is disposed within the post-treatment cover 520.

The second transfer unit 240 and the second interval adjusting unit 250 may be disposed on the output area OA of the main body 210. The second transfer unit 240 may discharge the processed circuit board P from the post-treatment chuck to the unloading part (UP).

Figure 13:
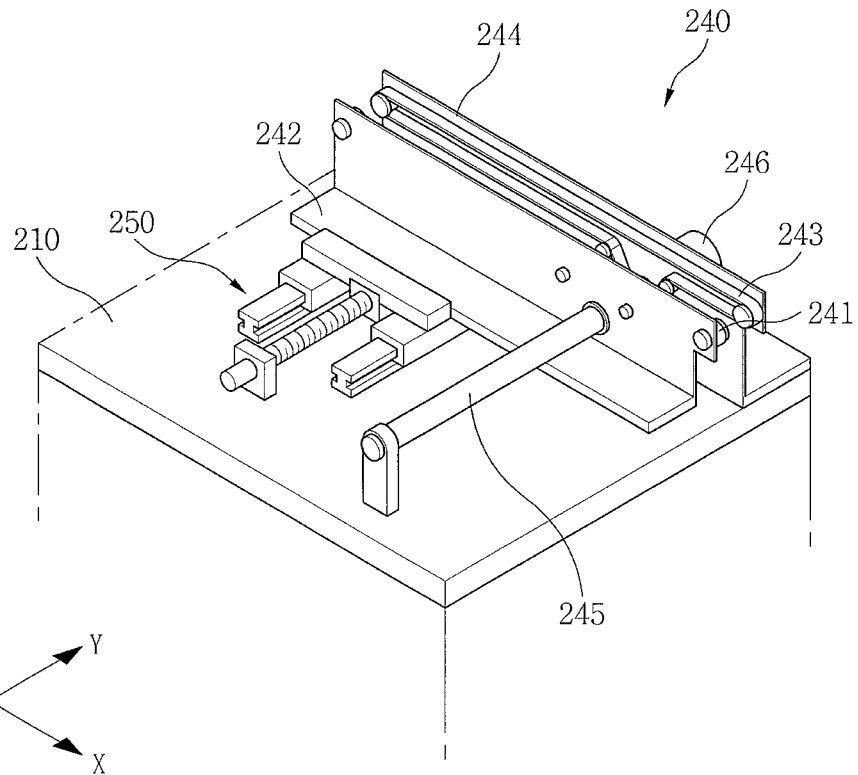
FIG. 13 is a perspective view illustrating an output area of a processing part of underfill equipment according to an embodiment of the inventive concepts.
Figure 14:
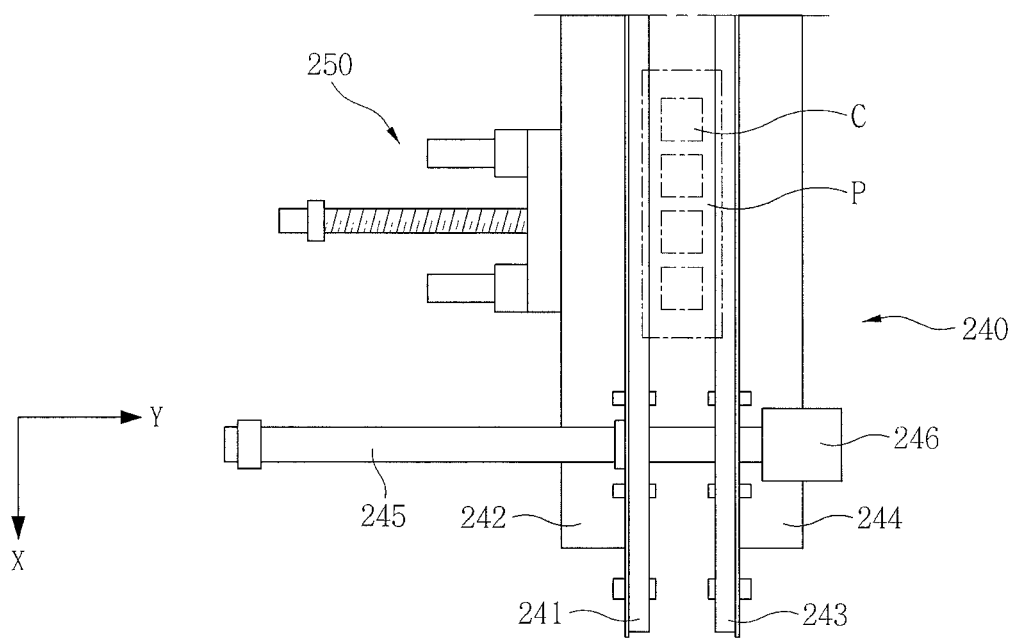
FIG. 14 is a top view illustrating an output area of a processing part of underfill equipment according to an embodiment of the inventive concepts.

As shown in FIGS. 13 and 14, the second transfer unit 240 may include a second left belt 241, a second left wall 242, a second right belt 243, a second right wall 244, a second belt shaft 245, and a second belt driver 246.

The second transfer unit 240 may have the same configuration as the first transfer unit 220. The second left belt 241, second left wall 242, second right belt 243, second right wall 244, second belt shaft 245, and second belt driver 246 of the second transfer unit 240 may have the configurations that are the same as, or similar to, the first left belt 221, first left wall 222, first right belt 223, first right wall 224, first belt shaft 225, and first belt driver 226 of the first transfer unit 220.

In some embodiments, the distance of the space between the second left belt 241 and the second right belt 243 may be equal to the distance of the space between the first left belt 221 and the first right belt 223. The distance of the space between the second left belt 241 and the second right belt 243 may be less than the horizontal width in the (Y-axis) direction of the circuit board P.

The second interval adjusting unit 250 may include a second left rail 251, a second left slider 252, a second right rail 253, a second right slider 254, a second bridge 255, a second nut 256, a second interval shaft 257, and a second interval driver 258.

The second interval adjusting unit 250 may have the same configuration as the first interval adjusting unit 230. For example, the second interval adjusting unit 250 may transfer the second left wall 242 of the second transfer unit 240 in the second (Y-axis) direction.

The second left rail 251, second left slider 252, second right rail 253, second right slider 254, second bridge 255, second nut 256, second interval shaft 257, and second interval driver 258 of the second interval adjusting unit 250 may have the same configurations as the first left rail 231, first left slider 232, first right rail 233, first right slider 234, first bridge 235, first nut 236, first interval shaft 237, and first interval driver 238 of the first interval adjusting unit 230. Therefore, reference is made to FIG. 7 above for detailed description thereof.

The circuit board P including the underfill material UM may be discharged from the processing part PP to the unloading part UP. As shown in FIG. 1, the unloading part UP may include an unloading elevator 610 in which at least one second magazine M2 is contained.

The unloading elevator 610 may transfer the second magazine M2 in the vertical (Z-axis) direction. For example, the unloading elevator 610 may lower the second magazine M2. The circuit board P discharged from the processing part PP may be sequentially received in the second magazine M2 from the bottom of the second magazine M2.

Figure 15:
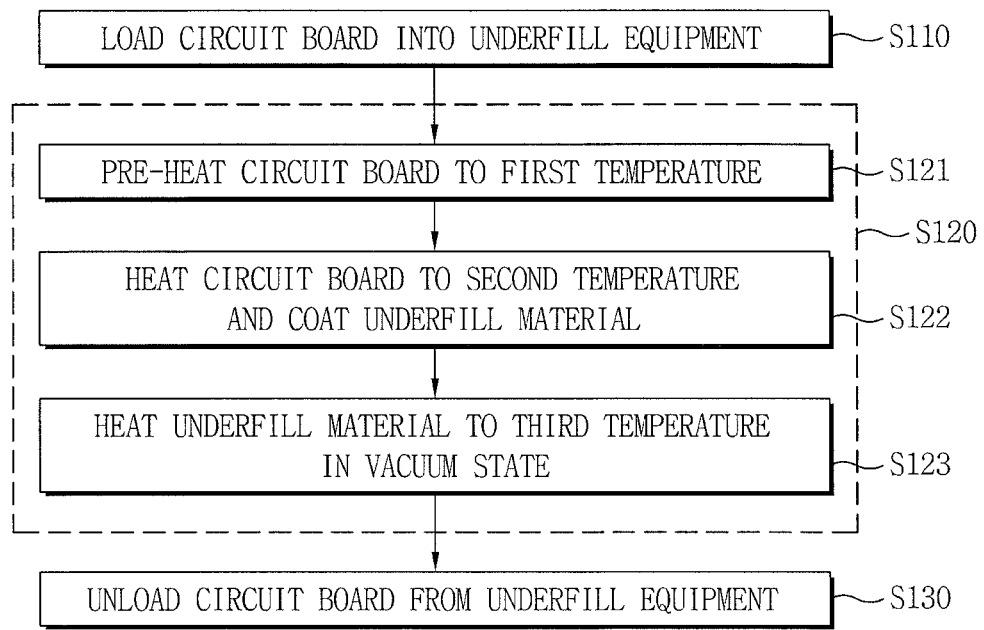
FIG. 15 is a flowchart illustrating a method of fabricating a semiconductor device using underfill equipment according to an embodiment of the inventive concepts.

FIG. 15 is a flow diagram illustrating a method of fabricating a semiconductor device using underfill equipment according to an embodiment of the inventive concepts.

Hereinafter, a method of fabricating a semiconductor device according to an embodiment of the inventive concepts will be described with reference to FIGS. 1 to 15. First, a method of fabricating a semiconductor device according to an embodiment of the inventive concepts may include a process S110 of loading the circuit board P into the underfill equipment 1.

Process S110 of loading the circuit board P into the underfill equipment 1 may include preparing the circuit board P including the at least one semiconductor chip C, receiving the circuit board P in the first magazine M1, stacking the first magazine M1 on the loading elevator 110 of the loading part LP of the underfill equipment 1, and transferring the circuit board P onto the first transfer unit 220 of the processing part PP of the underfill equipment 1.

The semiconductor chip C may be mounted on a first surface of the circuit board P. In some example embodiments, the semiconductor chip C may be flip-chip-bonded on the circuit board P. The connection members S may be disposed between the circuit board P and the semiconductor chip C.

The method of fabricating a semiconductor device according to the embodiment of the inventive concepts may include a process S120 of filling the underfill material UM in the space between the semiconductor chip C and the circuit board P.

Process S120 of filling the underfill material UM in the space between the semiconductor chip C and the circuit board P may include a process S121 of pre-heating the circuit board P to a first temperature, a process S122 of heating the circuit board P to a second temperature and coating the underfill material UM, and a process S123 of heating the underfill material UM to a third temperature in a vacuum state.

Process S121 of pre-heating the circuit board P to a first temperature may include transferring the circuit board P onto the pre-treatment chuck 310 of the underfill equipment 1, spacing the circuit board P from the first transfer unit 220, and pre-heating the circuit board P to the first temperature.

Spacing the circuit board P from the first transfer unit 220 may include lifting the pre-treatment chuck 310 as shown in FIG. 6. The pre-treatment chuck 310 may be lifted in the direction of the (Z-axis) to a position that is higher than the first left belt 221 and the first right belt 223 of the first transfer unit 220.

In the method of fabricating a semiconductor device according to the embodiments of the inventive concepts, the circuit board P is spaced from the first transfer unit 220 while pre-heating the circuit board P. Therefore, the method of fabricating a semiconductor device according to the embodiment of the inventive concepts can prevent other processes from being delayed by the process of pre-heating the circuit board P.

Pre-heating the circuit board P to a first temperature may include pre-heating the circuit board P to the first temperature using the first heater 301 of the pre-treatment chuck 310.

Process S122 of heating the circuit board P to a second temperature and coating the underfill material UM may include transferring the circuit board P pre-heated to the first temperature onto the depositing chuck 410 of the underfill equipment 1, transferring the circuit board P in proximity to a lower portion of the coating unit 420, heating the circuit board P to the second temperature, and coating the underfill material UM on the surface of the circuit board P between the semiconductor chip C and the circuit board P.

Transferring the circuit board P to a position that is in proximity to lower portion of the coating unit 420 may include lifting the depositing chuck 410 as shown in FIG. 8.

In the method of fabricating a semiconductor device according to the embodiment of the inventive concept, the circuit board P is transferred proximal to the coating unit 420 before the underfill material UM is coated on the one surface of the circuit board P. Therefore, the method of fabricating a semiconductor device according to the embodiment of the inventive concepts can coat the underfill material positioning a relatively accurate manner. Further, the method of fabricating a semiconductor device according to the embodiment of the inventive concepts can prevent other processes from being delayed by the process of coating the underfill material on the surface of the circuit board P.

Heating the circuit board P to a second temperature may include heating the circuit board P to the second temperature by the second heater 401 of the depositing chuck 410. The second temperature may be higher than the first temperature.

In the method of fabricating a semiconductor device according to the embodiment of the inventive concept, the circuit board P pre-heated to the first temperature is then heated to the second temperature. The second temperature may be higher than the first temperature. That is, in method of fabricating a semiconductor device according to the embodiment, the heating temperature of the circuit board P can be gradually increased and therefore the method can prevent the circuit board P from undergoing an instantaneous increase in temperature, and prevent the circuit board P from being damaged by the instantaneously large temperature difference.

Coating the underfill material UM on the one surface of the circuit board P may include transferring the coating nozzle 427 of the coating unit 420 close to the side of the semiconductor chip C, and coating the underfill material UM close to the side of the semiconductor chip C.

The underfill material UM coated close to the side of the semiconductor chip C flows in the space between the circuit board P and the semiconductor chip C by a capillary effect. The underfill material UM may surround the connection members S.

Coating the underfill material UM on the one surface of the circuit board P may be performed simultaneously with heating the circuit board P to the second temperature. The circuit board P heated to the second temperature causes the viscosity of the underfill material UM to be lowered. Therefore, the underfill material UM rapidly flows in the space between the circuit board P and the semiconductor chip C.

Transferring the coating nozzle 427 of the coating unit 420 close to the side of the semiconductor chip C may include transferring the first fixed slider 422 of the coating unit 420 in the first (X-axis) direction along the first fixed rail 421 of the coating unit 420, and transferring the first moving slider 424 of the coating unit 420 to the second (Y-axis) direction along the first moving rail 423 of the coating unit 420.

Process S123 of heating the underfill material UM to a third temperature in a vacuum state may include transferring the circuit board P including the underfill material UM onto the post-treatment chuck 510 of the underfill equipment 1, transferring the circuit board P to the within of the post-treatment cover 520 of the underfill equipment 1, sealing the post-treatment cover 520 to the post-treatment chuck, maintaining the inside of the post-treatment cover 520 at a vacuum state, and heating the underfill material UM to the third temperature.

Transferring the circuit board P onto the post-treatment chuck 510 of the underfill equipment 1 may include transferring the third transfer unit 260 of the underfill equipment 1 onto the first transfer unit 220, fixing the circuit board P to the third transfer unit 260, lifting the third transfer unit 260 to space the circuit board P from the first transfer unit 220, transferring the third transfer unit 260 onto the post-treatment chuck 510, and lowering the third transfer unit 260 to place the circuit board P on the post-treatment chuck 510.

Transferring the third transfer unit 260 onto the first transfer unit 220 may include transferring the second fixed slider 262 of the third transfer unit 260 to the first (X-axis) direction along the second fixed rail 261 of the third transfer unit 260, and transferring the second moving slider 264 of the third transfer unit 260 in the second (Y-axis) direction along the second moving rail 263 of the third transfer unit 260.

Fixing the circuit board P to the third transfer unit 260 of the underfill equipment 1 may include transferring the vertical rail 265 of the third transfer unit 260 onto the first transfer unit 220, lowering the vertical slider 266 of the third transfer unit 260, transferring the first fixed cramp 269a and the second fixed cramp 269b of the third transfer unit 260 to the center direction of the fixed bar 267 of the third transfer unit 260, and bringing the first fixed cramp 269a and the second fixed cramp 269b in contact with the an edge of the circuit board P.

Lowering the third transfer unit 260 to place the circuit board P on the post-treatment chuck 510 may include transferring the third transfer unit 260 to a non-overlapping region with the post-treatment chuck 510. For example, lowering the third transfer unit 260 to place the circuit board P on the post-treatment chuck 510 may include transferring the first fixed cramp 269a and the second fixed cramp 269b to an edge side of the fixed bar 267, and transferring the second moving rail 263 onto the first transfer unit 220. Lowering the third transfer unit 260 to place the circuit board P onto the post-treatment chuck 510 may further include transferring the vertical rail 265 to the second fixed rail 261 side.

Transferring the circuit board P to the inside of the post-treatment cover 520 may include lifting the post-treatment chuck 510 using the third chuck driving unit 511 as shown in FIG. 12.

Sealing the post-treatment cover 520 may include covering the opened area of the post-treatment cover 520 with the post-treatment chuck 510. For example, sealing the post-treatment cover 520 may include lifting the post-treatment chuck 510 using the third chuck driving unit 511, and adhering the post-treatment chuck 510 to the opened bottom of the post-treatment cover 520. Sealing the post-treatment cover 520 may be performed simultaneously with transferring the circuit board P to the inside of the post-treatment cover 520.

Maintaining the inside of the post-treatment cover 520 to a vacuum state may include exhausting the inside of the post-treatment cover 520 using the third vacuum holes 502 of the post-treatment chuck 510.

Heating the underfill material UM to a third temperature may include heating the circuit board P by the third heater 501 of the post-treatment chuck 510.

In the method of fabricating a semiconductor device according to the embodiment of the inventive concept, the underfill material UM filled in the space between the circuit board P and the semiconductor chip C is heated to the third temperature in the vacuum state. Voids may be present within the underfill material UM filled in the space between the circuit board P and the semiconductor chip C. Voids within the underfill material UM may be present due to the arrangement of the connection members S between the circuit board P and the semiconductor chip C. Voids may be reduced in size or eliminated by exposing the underfill material to a change in pressure around the void while exposed to a vacuum state. In this sense, a vacuum state is considered herein to include a fully vacuum state or a state of greatly reduced pressure. The heat treatment to the third temperature while in the vacuum state reduces the viscosity of the underfill material UM during the vacuum application. Therefore, the method of fabricating a semiconductor device according to the embodiment of the inventive concepts provides for the heating of the underfill material UM to the third temperature while in the vacuum state in order to remove or substantially eliminate voids that are present in the underfill material UM. This can be accomplished in a relatively short amount of time due to the reduced viscosity of the underfill material UM.

Subsequently, the method of fabricating a semiconductor device according to the embodiment of the inventive concepts may include a process S130 of unloading the circuit board P from the underfill equipment 1.

Process S130 of unloading the circuit board P from the underfill equipment 1 may include transferring the third transfer unit 260 onto the post-treatment chuck 510, fixing the circuit board P to the third transfer unit 260, lifting the third transfer unit 260 to space the circuit board P from the post-treatment chuck 510, transferring the third transfer unit 260 onto the second transfer unit 240, and lowering the third transfer unit 260 to place the circuit board P on the second transfer unit 240.

Figure 16:
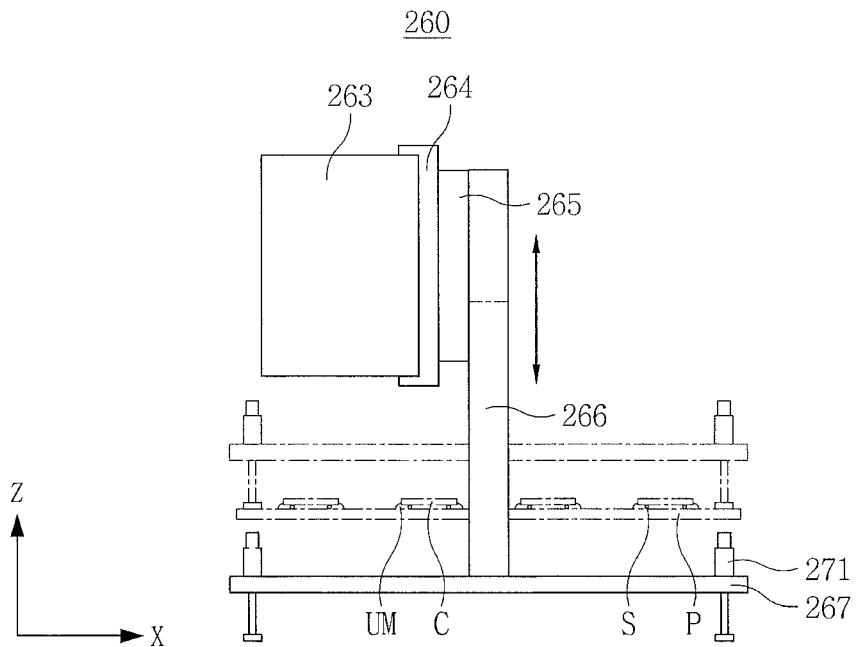
FIG. 16 is a side view illustrating a third transfer unit of underfill equipment according to an embodiment of the inventive concepts.

FIG. 16 is a side view illustrating a third transfer unit of underfill equipment according to an embodiment of the inventive concepts.

Referring to FIG. 16, a third transfer unit 260 of underfill equipment according to an embodiment of the inventive concepts may include a second moving rail 263, a second moving slider 264, a vertical rail 265, a vertical slider 266, a fixed bar 267, and adsorbers 271.

The adsorbers 271 may fix the circuit board P including the underfill material UM. The adsorbers 271 may be disposed at both edges of the fixed bar 267. The adsorbers 271 may be arranged in the fixed bar 267 in the first (X-axis) direction.

Figure 17:
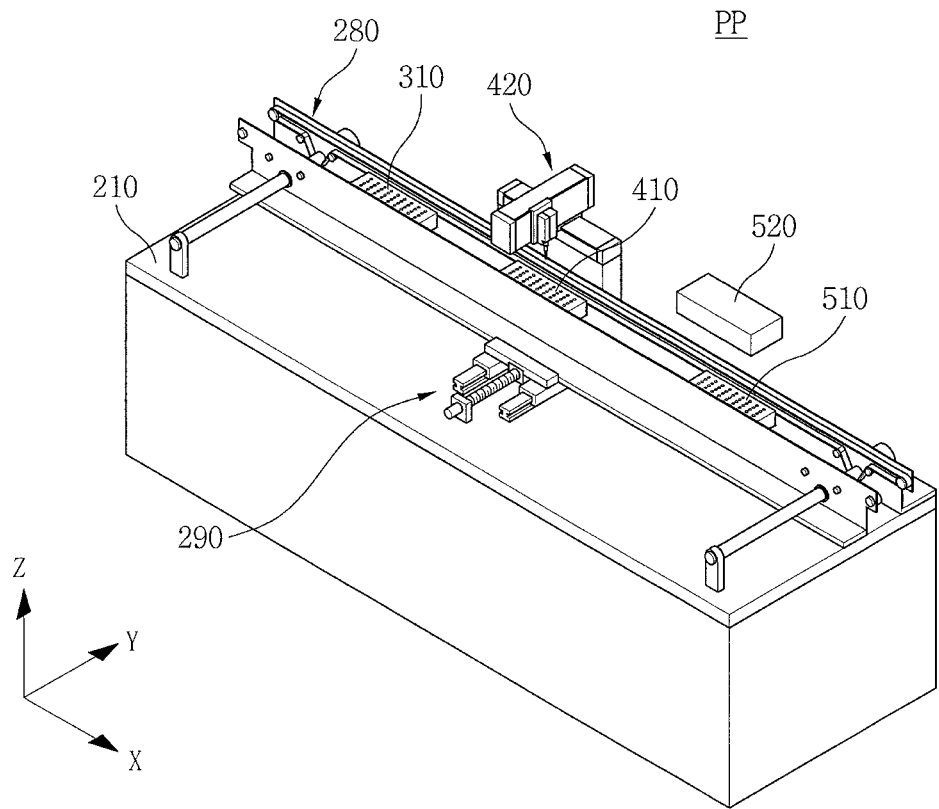
FIG. 17 is a perspective view illustrating a processing part of underfill equipment according to an embodiment of the inventive concepts.

FIG. 17 is a perspective view illustrating a processing part of underfill equipment according to an embodiment of the inventive concepts. FIGS. 18 to 24 are views partially illustrating a processing part of underfill equipment according to an embodiment of the inventive concepts.

Referring to FIGS. 17 to 24, a processing part (PP) of underfill equipment according to an embodiment of the inventive concepts may include a main body 210, a fourth transfer unit 280, a third interval adjusting unit 290, a pre-treatment chuck 310, a depositing chuck 410, a coating unit 420, a post-treatment chuck 510, and a post-treatment cover 520.

Figure 18:
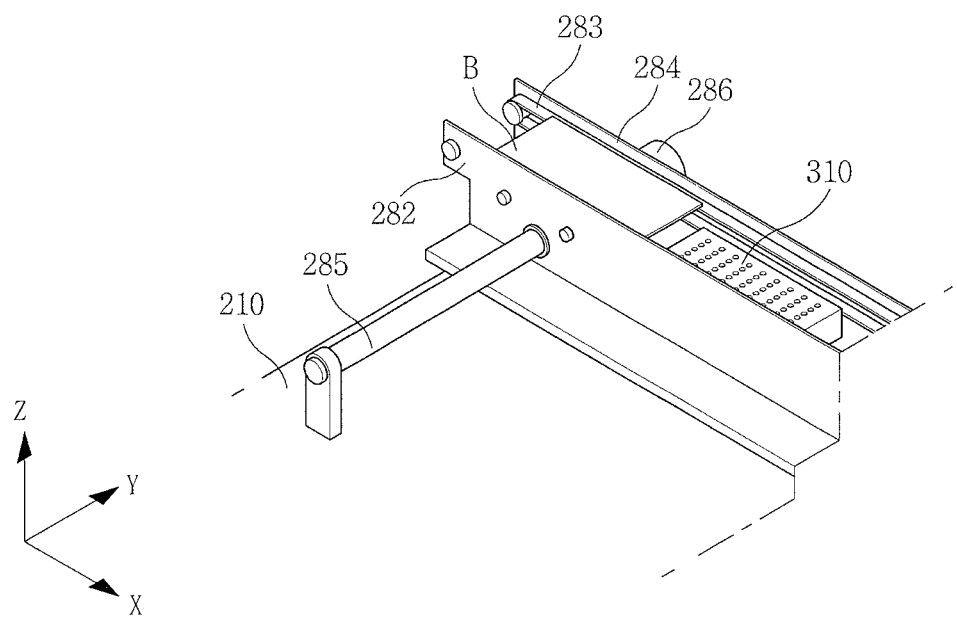
FIG. 18 is a perspective view illustrating an inlet area and a pre-treatment area of a processing part of underfill equipment according to an embodiment of the inventive concepts.
Figure 19:
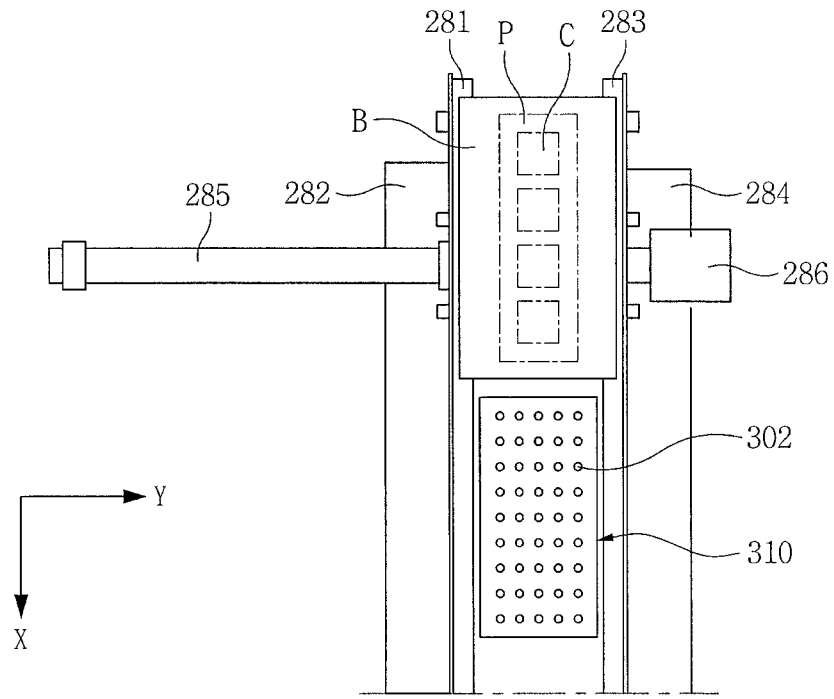
FIG. 19 is a top view illustrating an inlet area and a pre-treatment area of a processing part of underfill equipment according to an embodiment of the inventive concepts.
Figure 20:
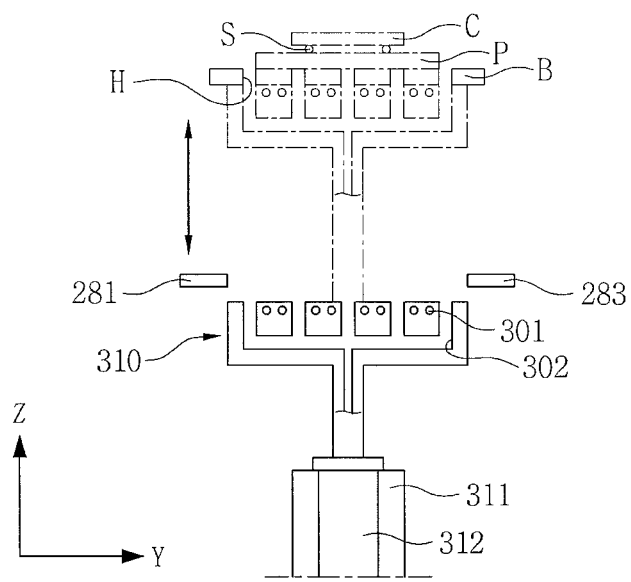
FIG. 20 is a cross-sectional view illustrating a pre-treatment chuck of underfill equipment according to an embodiment of the inventive concepts.

As shown in FIGS. 18 and 19, the fourth transfer unit 280 may extend to the first (X-axis) direction. The fourth transfer unit 280 may include a third left belt 281, a third left wall 282, a third right belt 283, a third right wall 284, a third belt shaft 285, and a third belt driver 286.

The distance spaced between the third left belt 281 and the third right belt 283 may be larger than the horizontal width of the circuit board P. The distance spaced between the third left belt 281 and the third right belt 283 may be larger than the horizontal width of the post-treatment chuck 510. The pre-treatment chuck 310, the depositing chuck 410, and the post-treatment chuck 510 may be disposed between the third left wall 282 and the third right wall 284 of the fourth transfer unit 280. For example, the horizontal width of the pre-treatment chuck 310 and the horizontal width of the depositing chuck 410 may be equal to that of the post-treatment chuck 510.

The fourth transfer unit 280 may further include a transfer board B. The transfer board B may move over the pre-treatment chuck 310, the depositing chuck 410, and the post-treatment chuck 510 by the fourth transfer unit 280. The circuit board P to be processed may be placed on the transfer board B. The transfer board B may include through holes H. The through holes H may be vertically aligned with first vacuum holes 302 of the pre-treatment chuck 310, second vacuum holes 402 of the depositing chuck 410, and third vacuum holes 502 of the post-treatment chuck 510.

In some embodiments, the horizontal width of the transfer board B may be greater than the distance spaced between the third left belt 281 and the third right belt 283. The horizontal width of the transfer board B may be less than the distance spaced between the third left wall 282 and the third right wall 284. The transfer board B may be disposed on the third left belt 281 and the third right belt 283 of the fourth transfer unit 280.

Figure 24:
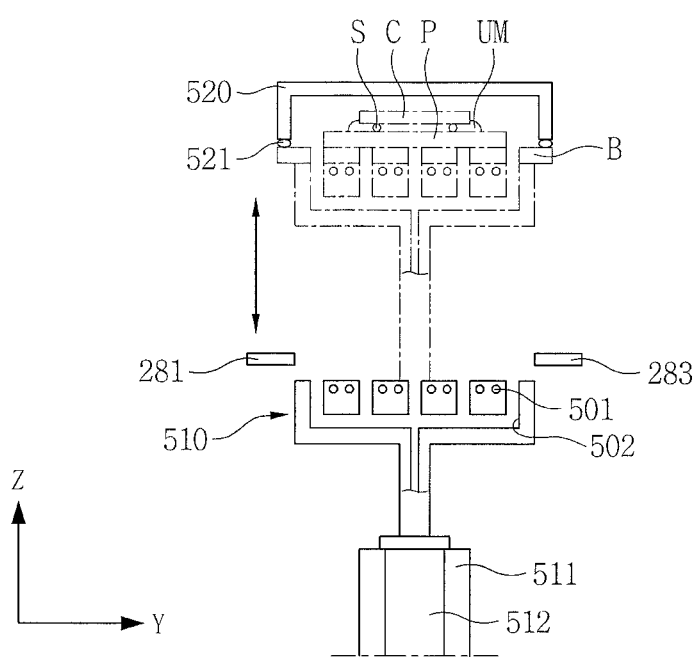
FIG. 24 is a cross-sectional view illustrating a post-treatment chuck and a post-treatment cover according to an embodiment of the inventive concepts.

As shown in FIG. 24, the horizontal width of the transfer board B may be relatively equal to the horizontal width of the post-treatment cover 520. The horizontal length of the transfer board B may be equal to the horizontal length of the post-treatment cover 520. The transfer board B may cover an opened bottom of the post-treatment cover 520. The inside of the post-treatment cover 520 may be sealed by the transfer board B.

The third interval adjusting unit 290 may adjust an interval of the fourth transfer unit 280. For example, the third interval adjusting unit 290 may transfer the third left wall 282 of the fourth transfer unit 280 to the second (Y-axis) direction.

Figure 21:
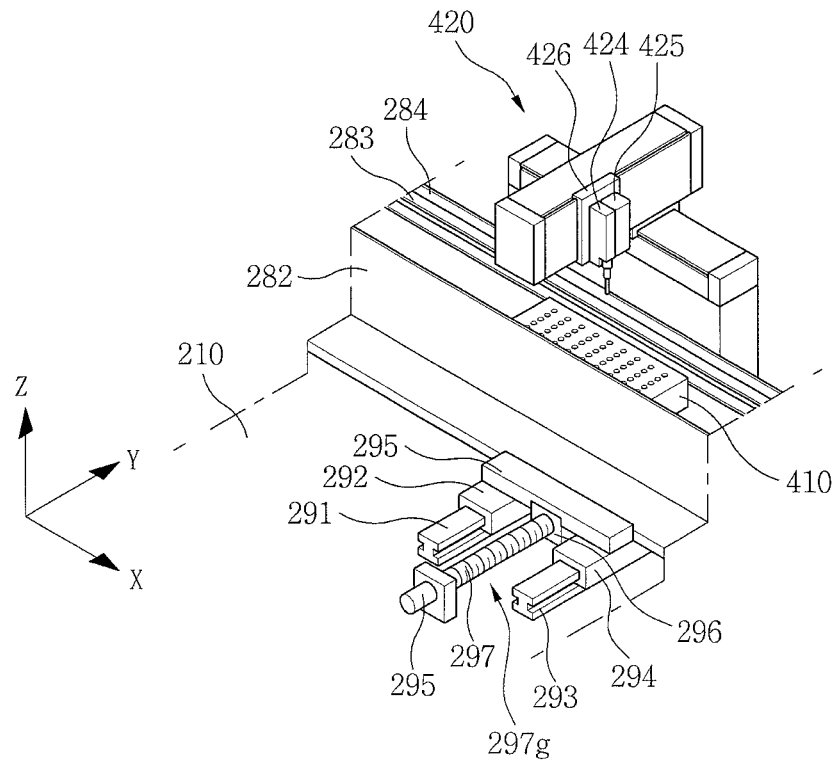
FIG. 21 is a perspective view illustrating a coating area of a processing part of underfill equipment according to an embodiment of the inventive concepts.
Figure 22:
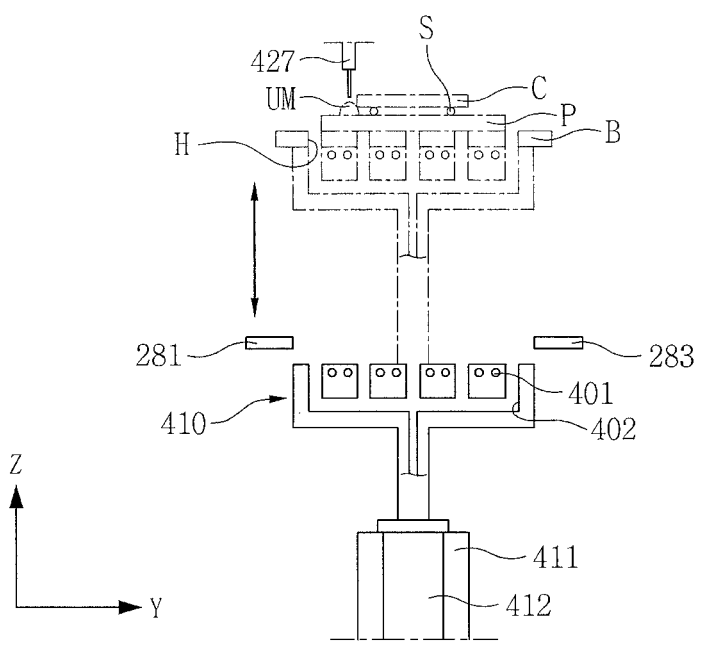
FIG. 22 is a cross-sectional view illustrating a depositing chuck of underfill equipment according to an embodiment of the inventive concepts.
Figure 23:
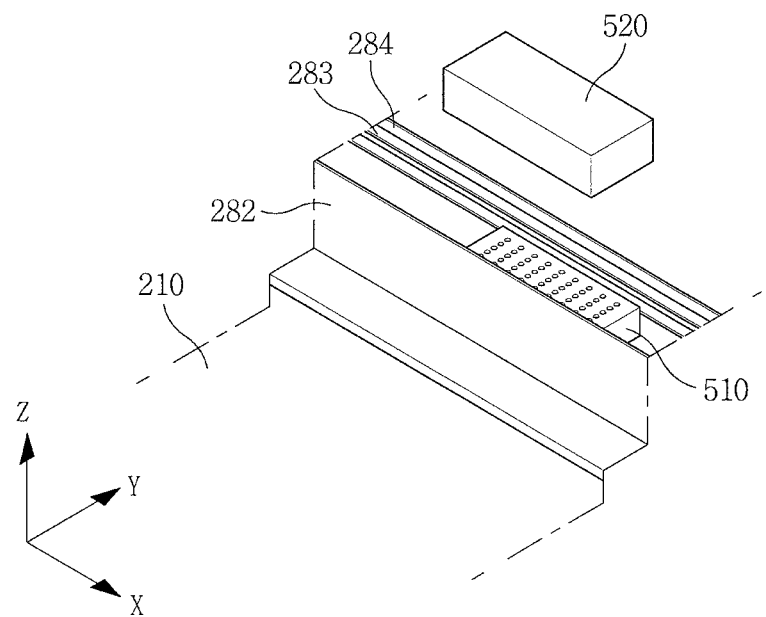
FIG. 23 is a perspective view illustrating a post-treatment area of a processing part of underfill equipment according to an embodiment of the inventive concepts.

As shown in FIG. 21, the third interval adjusting unit 290 may include a third left rail 291, a third left slider 292, a third right rail 293, a third right slider 294, a third bridge 295, a third nut 296, a third interval shaft 297, and a third interval driver 298.

The third left rail 291 and the third right rail 293 may extend to the second direction (Y-axis). The third left rail 291 and the third right rail 293 may be parallel to each other. The third interval shaft 297 may be disposed between the third left rail 291 and the third right rail 293. The third bridge 295 may connect the third left slider 292 and the third right slider 294. The third nut 296 may be coupled to the third bridge 295. The nut 296 may move along the third interval shaft 297. The third interval driver 298 may rotate the third interval shaft 297.

Figure 25:
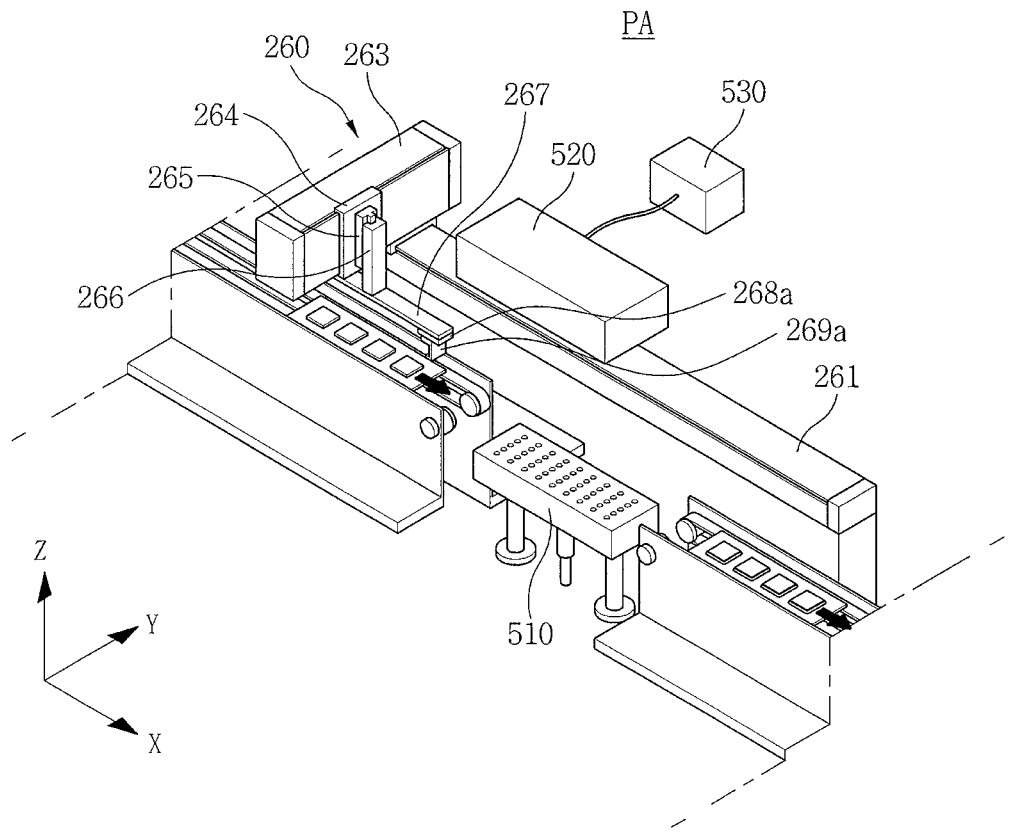
FIG. 25 is a perspective view illustrating a post-treatment area of a processing part of underfill equipment according to an embodiment of the inventive concepts.
Figure 26:
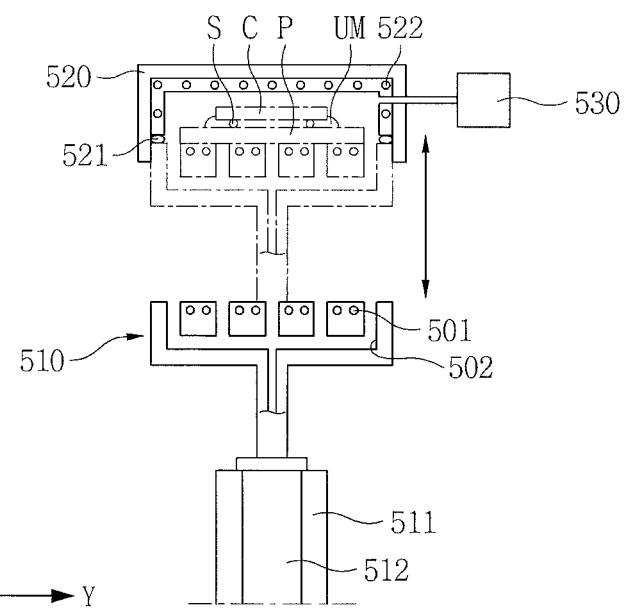
FIG. 26 is a cross-sectional view illustrating a post-treatment chuck and a post-treatment cover of underfill equipment according to an embodiment of the inventive concepts.

FIGS. 25 and 26 are views illustrating a post-treatment area of a processing part of underfill equipment according to an embodiment of the inventive concepts.

Referring to FIGS. 25 and 26, a third transfer unit 260, a post-treatment chuck 510, a post-treatment cover 520, and a cover vacuum pump 530 may be disposed on a post-treatment area of underfill equipment according to an embodiment of the inventive concepts.

The cover vacuum pump 530 may exhaust the inside of the post-treatment cover 520. For example, the cover vacuum pump 530 may maintain the inside of the post-treatment cover 520 to a vacuum state while heating an underfill material UM of a circuit board P to a third temperature.

The post-treatment cover 520 may further include a cover heater 522 in an inner side thereof. The cover heater 522 may heat the underfill material UM of the circuit board P transferred inside the post-treatment cover 520 to the third temperature.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concepts as defined in the claims. In the claims, means-plus-function clauses are intended to cover the structures described herein as performing the recited function, and not only structural equivalents but also equivalent structures.

What is claimed is:

1. A method of fabricating a semiconductor device, comprising:
   loading a circuit board including a semiconductor chip into an underfill equipment;
   positioning the circuit board on a depositing chuck of the underfill equipment;
   filling an underfill material in a space between the semiconductor chip and the circuit board positioned on the depositing chuck;
   moving the circuit board including the underfill material so that it is positioned on a post-treatment chuck of the underfill equipment;
   heating the underfill material in the space between the semiconductor chip and of the circuit board placed on the post-treatment chuck in a vacuum state; and
   unloading the circuit board including the underfill material which has been heated in the vacuum state, from the underfill equipment,
   wherein heating the underfill material in the space between the semiconductor chip and the circuit board in a vacuum state includes:
   moving the circuit board on the post-treatment chuck to within a post-treatment cover;
   sealing the post-treatment cover;
   maintaining an interior volume of the post-treatment cover in the vacuum state; and
   heating the underfill material, and
   wherein sealing the post-treatment cover includes closing an opened area of the post-treatment cover with the post-treatment chuck.

2. The method of claim 1, wherein closing an opened area of the post-treatment cover with the post-treatment chuck is performed simultaneously with moving the circuit board to within the post-treatment cover.

3. The method of claim 1, wherein maintaining the interior volume of the post-treatment cover in the vacuum state includes exhausting the interior volume of the post-treatment cover through a vacuum hole of the post-treatment chuck.

4. The method of claim 1, wherein heating the underfill material includes heating the circuit board using a heater of the post-treatment chuck.

5. The method of claim 1, wherein loading the circuit board into the underfill equipment includes moving the circuit board on a first transfer unit of the underfill equipment,
   wherein unloading the circuit board from the underfill equipment includes moving the circuit board to a second transfer unit of the underfill equipment.

6. The method of claim 5, wherein moving the circuit board so that it is positioned on the post-treatment chuck includes:
   positioning the circuit board at a third transfer unit of the underfill equipment;
   raising the third transfer unit to space the circuit board from the first transfer unit;
   moving the third transfer unit to a position above the post-treatment chuck; and
   lowering the third transfer unit.

7. The method of claim 1, wherein filling the underfill material in a space between the semiconductor chip and the circuit board includes:
   heating the circuit board using a heater of the depositing chuck; and
   depositing the underfill material on the circuit board at a side position of the semiconductor chip.

8. The method of claim 7, wherein filling the underfill material in a space between the circuit board and the semiconductor chip includes raising the circuit board from a first transfer unit.

9. The method of claim 7, further comprising:
   moving the circuit board on a pre-treatment chuck of the underfill equipment before filling the underfill material in a space between the circuit board and the semiconductor chip; and
   pre-heating the circuit board by a heater of the pre-treatment chuck.

10. A method of fabricating a semiconductor device, comprising:
    performing an underfill operation on a semiconductor chip applied to a circuit board to provide an underfill material between the semiconductor chip and the circuit board; and
    following performing the underfill operation, performing a post-treatment operation on the underfill material by:
    placing the underfill material in a vacuum state; and
    while the underfill material is placed in a vacuum state, heating the underfill material, wherein performing the post-treatment operation comprises:
applying the circuit board to a post-treatment chuck;
sealing the post-treatment chuck with a post-treatment cover to contain a volume including the underfill material; and
applying a vacuum to the volume while heating the underfill material,
wherein performing the underfill operation comprises positioning the circuit board on a transfer board, and wherein sealing the post-treatment chuck with the post-treatment cover comprises raising the transfer board using the post-treatment chuck.

11. The method of claim 10 wherein heating the underfill material while the underfill material is in a vacuum state comprises heating the underfill material to lower a viscosity of the underfill material.

12. The method of claim 10 further comprising heating the circuit board and semiconductor chip during performing the underfill operation.

* * * * *